US007606695B1

(12) United States Patent
Nouri et al.

(10) Patent No.: US 7,606,695 B1
(45) Date of Patent: Oct. 20, 2009

(54) SELF-CHECKING SIMULATIONS USING DYNAMIC DATA LOADING

(75) Inventors: Nasser Nouri, San Jose, CA (US); Victor A. Chang, Palo Alto, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 475 days.

(21) Appl. No.: 10/675,748

(22) Filed: Sep. 30, 2003

(51) Int. Cl.
G06F 9/45 (2006.01)
G06F 9/44 (2006.01)
G06F 9/00 (2006.01)
G06F 9/445 (2006.01)
G06F 11/00 (2006.01)
G06F 11/26 (2006.01)
G06F 11/277 (2006.01)
G06F 11/36 (2006.01)
G06F 17/50 (2006.01)
G06F 17/00 (2006.01)

(52) U.S. Cl. ............... 703/22; 714/37; 714/38; 714/39; 714/741; 703/14; 717/124; 717/125; 717/134; 717/135; 702/121

(58) Field of Classification Search .......... 703/14, 703/22; 717/124–125, 134–135; 702/121; 714/37–39, 741
See application file for complete search history.

(56) References Cited

U.S. PATENT DOCUMENTS

| 5,812,416 | A | * | 9/1998 | Gupte et al. ............... 716/2 |
| 5,920,490 | A | * | 7/1999 | Peters ...................... 716/2 |
| 5,928,334 | A | * | 7/1999 | Mandyam et al. ........ 709/248 |
| 6,141,630 | A | * | 10/2000 | McNamara et al. ....... 703/14 |
| 6,182,258 | B1 | * | 1/2001 | Hollander ............... 714/739 |
| 6,601,024 | B1 | * | 7/2003 | Chonnad et al. .......... 703/14 |
| 6,606,721 | B1 | * | 8/2003 | Gowin et al. ............ 714/728 |
| 6,625,759 | B1 | * | 9/2003 | Petsinger et al. .......... 714/28 |
| 6,678,645 | B1 | * | 1/2004 | Rajsuman et al. ......... 703/20 |
| 6,871,298 | B1 | * | 3/2005 | Cavanaugh et al. ....... 714/33 |
| 6,886,145 | B2 | * | 4/2005 | Davidson et al. .......... 716/6 |
| 7,017,150 | B2 | * | 3/2006 | Lam et al. .............. 717/124 |
| 7,139,936 | B2 | * | 11/2006 | Petsinger et al. .......... 714/28 |
| 7,178,063 | B1 | * | 2/2007 | Smith .................... 714/38 |
| 2005/0120278 | A1 | * | 6/2005 | Smith et al. ............. 714/43 |

\* cited by examiner

*Primary Examiner*—Kamini S Shah
*Assistant Examiner*—Suzanne Lo
(74) *Attorney, Agent, or Firm*—Osha • Liang LLP

(57) ABSTRACT

A system for evaluating a simulation includes a reference simulator configured to execute a simulation image to obtain golden data, a test simulator configured to execute the simulation image to obtain test data, and a comparator configured to generate a comparison result by comparing a portion of the golden data to a portion of the test data before the execution of the simulation image on the test simulator has completed.

18 Claims, 6 Drawing Sheets

SELF-CHECKING SIMULATIONS USING DYNAMIC DATA LOADING

BACKGROUND OF INVENTION

Due to the complexity of modern electronic circuitry, designs for electronic circuits are often subjected to a rigorous verification process in order to detect errors. Often, simulation of the design for the circuitry is used to help locate and detect errors in the design and thus debug and/or verify the correctness of the design. Simulation of a design may occur at low levels of abstraction, e.g., at a "switch-level." Switch-level simulations typically include active circuit elements (e.g., transistors) and passive circuit elements (e.g., resistors, capacitors, and inductors).

Simulation also may occur at a higher level of abstraction, e.g., a "behavioral level." Behavioral level simulations typically use a hardware description language (HDL) that determines the functionality of a single circuit element or group of circuit elements. Examples of typical behavioral level simulation languages are Very High Speed Integrated Circuit HDL (VHDL) and Verilog. Using Verilog, for example, electronic circuitry is described as a set of modules, each of which is part of a design of a circuit, circuits, or a device. Modules written in an HDL may be used to represent circuit elements of hardware ranging from simple gates to complete systems.

A design, e.g., a simulation or logic design, may be simulated on more than one type of simulator in order to facilitate verification of the design and/or the simulator. For example, a design may be simulated on a hardware accelerator and/or a software simulator. The hardware accelerator is a dedicated computer designed for a specific purpose, such as verifying designs. A software simulator is a computer program (which may be written in an HDL) that may run on a standard computer.

Often, a design is first simulated on a reference simulator, which provides reference, or "golden" data. The golden data is used as a reference or standard (i.e., an "expected" output) for later simulations and to compared against results of test simulators. These simulations may be performed on a different type of simulator and/or after the design has undergone modifications or re-implementation.

FIG. 1 shows a system for verifying a simulation on two simulators, namely, a reference simulator and a test simulator. The system includes a design (20), user data (22), a compiler (28), a simulation image (30), a reference simulator (32), a test simulator (34), a golden data repository (40), and a comparator (42).

The design (e.g., Verilog modules) (20) and the user data (22) are compiled by the compiler (28) producing a simulation image (30), i.e., a binary executable file. The design (20) includes instructions for simulating circuit elements by executing the simulation image (30) on the reference simulator (32) and the test simulator (34). The user data (22) includes stimuli (24) and comparison data (26).

The stimuli (24) include instructions for stimulating (or exercising) particular portions of a simulation image (30) during the simulation in order to generate the test data (38) and the golden data (36). For example, the design (20) may include a particular circuit element, such as a gate. A designer may include instructions in the stimuli (24) so that a stimulus (e.g., a value of "1") is sent as an input to the gate at a particular point of the simulation (e.g., 500 seconds into the simulation), or during a particular cycle of the simulation (e.g., the $100^{th}$ cycle of the simulation). The effect of the stimulus (such as the value of "1") generates a particular output of the gate, which may be included in the test data (38) and/or the golden data (36).

The comparison data (26) includes instructions that specify particular values of interest to the designer for comparison purposes. For example, the designer may want to compare the reference simulator output of the aforementioned gate at a particular point of the simulation to the test simulator output of the aforementioned gate at that point of the simulation. The comparison data (26) includes instructions from the user data (22) to specify which signals of the design simulation are used for comparison purposes and at what point the signals are compared.

Executing the simulation image (30) on the reference simulator (32) generates golden data (36), which is stored in the golden data repository (40). Executing the simulation image (30) on the test simulator (34) generates test data (38). The comparator (42) receives test data (38) and the golden data (36) as input. The golden data is typically obtained from the golden data repository (40).

The comparator (42) compares the test data (38) to the golden data (36) and generates output in the form of a comparison result, which may be used to evaluate (i.e., debug and/or verify) the test simulator (34) and/or the design (20). For example, for the aforementioned gate, the comparator (42) may use the comparison data (26) to compare the output of the gate at the $500^{th}$ cycle of a simulation for both the reference simulator (32) and the test simulator (34). If the comparison shows a difference between the output of the gate on the reference simulator (32) and the output of the gate on the test simulator (34), this may be an indication that the test simulator is defective.

Often, the design (20) is simulated on the test simulator (34) well after the design (20) is simulated on the reference simulator (32). For example, after the design (20) is first simulated on the reference simulator (32), the test simulator (34) is re-implemented (e.g., written in a different computer language, debugged, etc.) and then the design is simulated on the test simulator (34) days, weeks, months, etc. later. In this example, the resulting test data (38) generated by the test simulator (34) is compared to the same golden data (36) previously generated by reference simulator (32).

FIG. 2 shows a flowchart for a simulation verification using the system shown in FIG. 1. Initially, the design and user data for the design are obtained (Step 80). Typically, the design and user data are created by a designer or team of designers using industry-standard tools, such as a testbench, designed for design verification.

Then, the design is compiled (with the user data) to generate a simulation image (Step 82). The simulation image is loaded (Step 84), and simulated (Step 86) on the reference simulator. Once the simulation is complete on the reference simulator, the golden data from the simulation is stored in the golden data repository (Step 88). Generally, the golden data is a record of values of signals (i.e., waveforms) from the simulation. For example, a particular waveform may represent the output value of a gate at specific points during the simulation.

Once the golden data has been stored, the simulation image is loaded onto (Step 90), and simulated (Step 92) on the test simulator. As a result of simulation on the test simulator, test data is generated. From the test data and the golden data, the comparator selects golden data and test data for comparison according to the instructions of the comparison data (which are included in the simulation image as executable code) (Step 94). The selected golden data and selected test data is then compared to obtain a comparison result (Step 96).

Next, the designer debugs the test simulator and/or design using the comparison result (Step 98). For example, the designer may detect an error if a mismatch between selected test data and selected reference data occurs, after which the designer may correct and recompile the test simulator, and continue verification of the simulation.

If the designer wishes to change the stimuli and/or comparison data, the designer may create new user data and recompile the design to generate another simulation image. Likewise, while the simulation is performing on the test simulator, if the designer needs to revise stimuli or comparison data for simulation, the designer may halt the ongoing simulation, revise the stimuli and/or comparison data, recompile the design and user data, and begin simulation again.

SUMMARY OF INVENTION

In general, in one aspect, the present invention involves a system for evaluating a simulation. The system comprises a reference simulator configured to execute a simulation image to obtain golden data, a test simulator configured to execute the simulation image to obtain test data, and a comparator configured to generate a comparison result by comparing a portion of the golden data to a portion of the test data before the execution of the simulation image on the test simulator has completed.

In general, in one aspect, the present invention involves a method of evaluating a simulation. The method comprises executing a simulation image on a reference simulator to obtain golden data, executing the simulation image on a test simulator to obtain test data, selecting a portion of the golden data and a portion of the test data, and comparing the selected golden data to the selected test data to obtain a comparison result.

In general, in one aspect, the present invention involves a computer system for evaluating a simulation. The computer system comprises a processor, a memory, a storage device, and software instructions. The software instructions stored in the memory for enabling the computer system to execute a simulation image on a reference simulator to obtain golden data, execute the simulation image on a test simulator to obtain test data, select a portion of the golden data and a portion of the test data, and compare the selected golden data to the selected test data to obtain a comparison result.

In general, in one aspect, the present invention involves an apparatus for evaluating a simulation. The apparatus comprises means for executing a simulation image on a reference simulator to obtain golden data, means for executing the simulation image on a test simulator to obtain test data, means for selecting a portion of the golden data and a portion of the test data, and means for comparing the selected golden data to the selected test data to obtain a comparison result.

Other aspects and advantages of the invention will be apparent from the following description and the appended claims.

DETAILED DESCRIPTION

Figure 1:
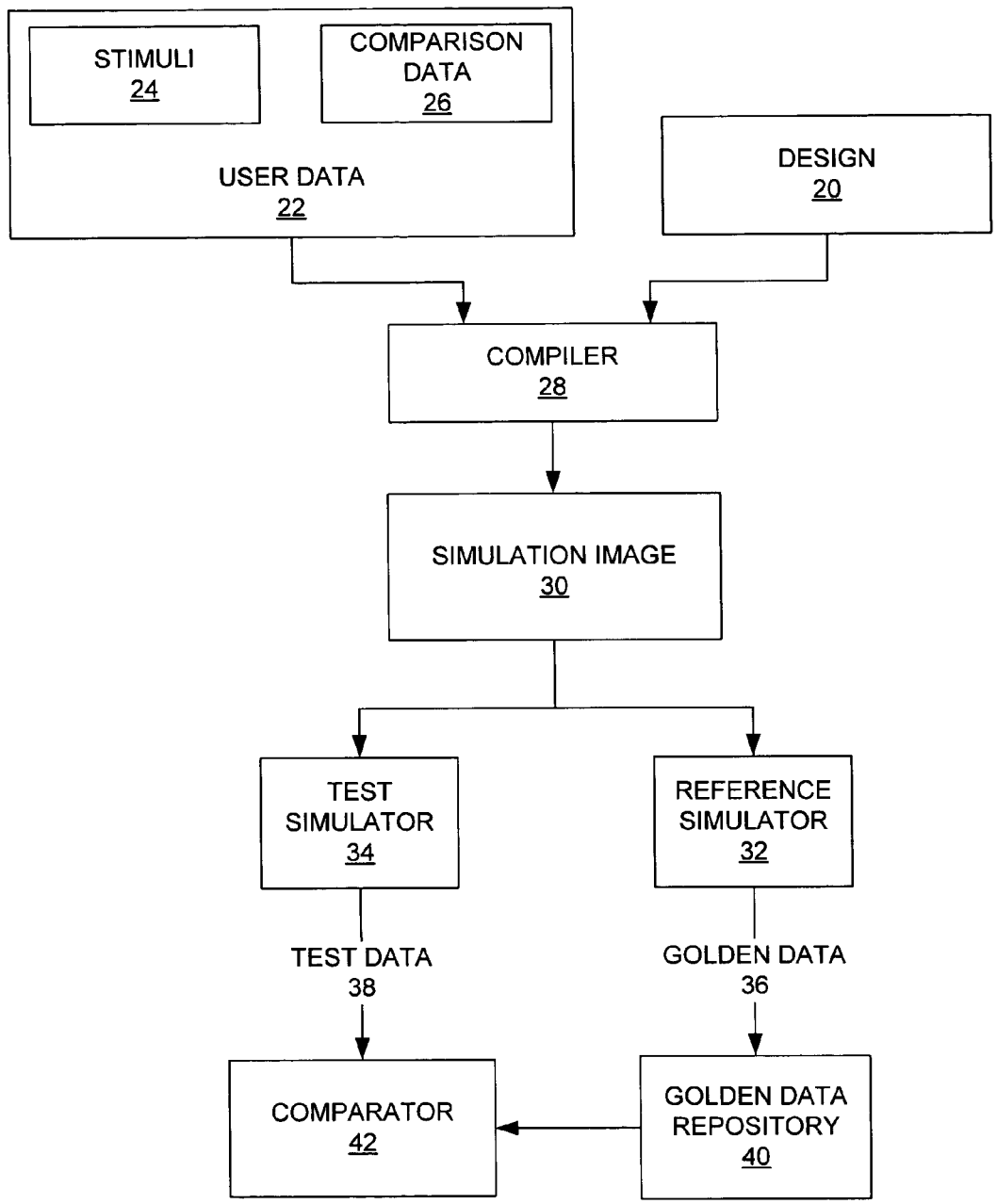
FIG. 1 shows a system for verifying a simulation.
Figure 2:
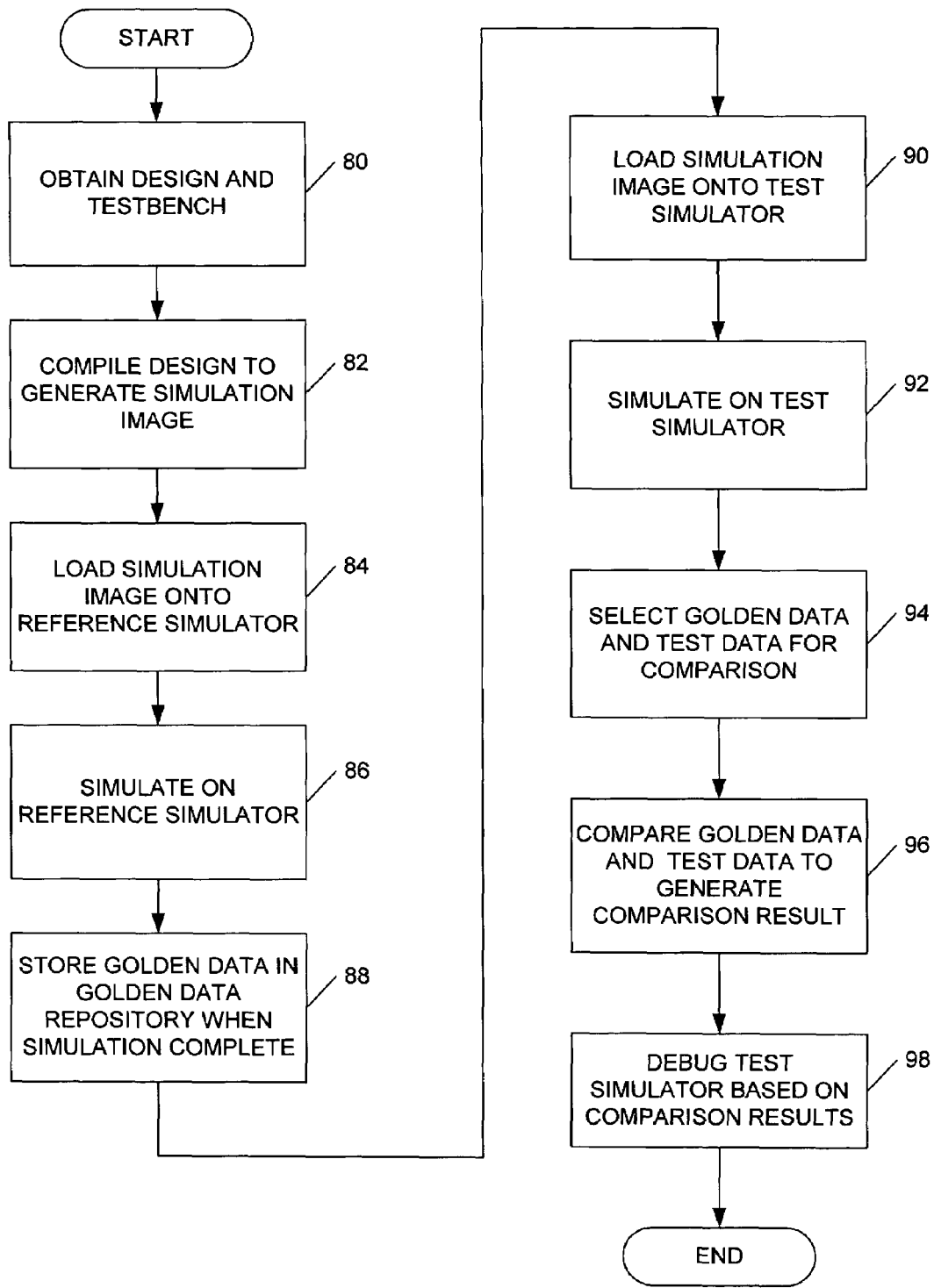
FIG. 2 shows a flowchart for simulation verification using the system of FIG. 1.

Specific embodiments of the invention will now be described in detail with reference to the accompanying figures. Like elements in the various figures are denoted by like reference numerals for consistency.

In the following detailed description of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Figure 3:
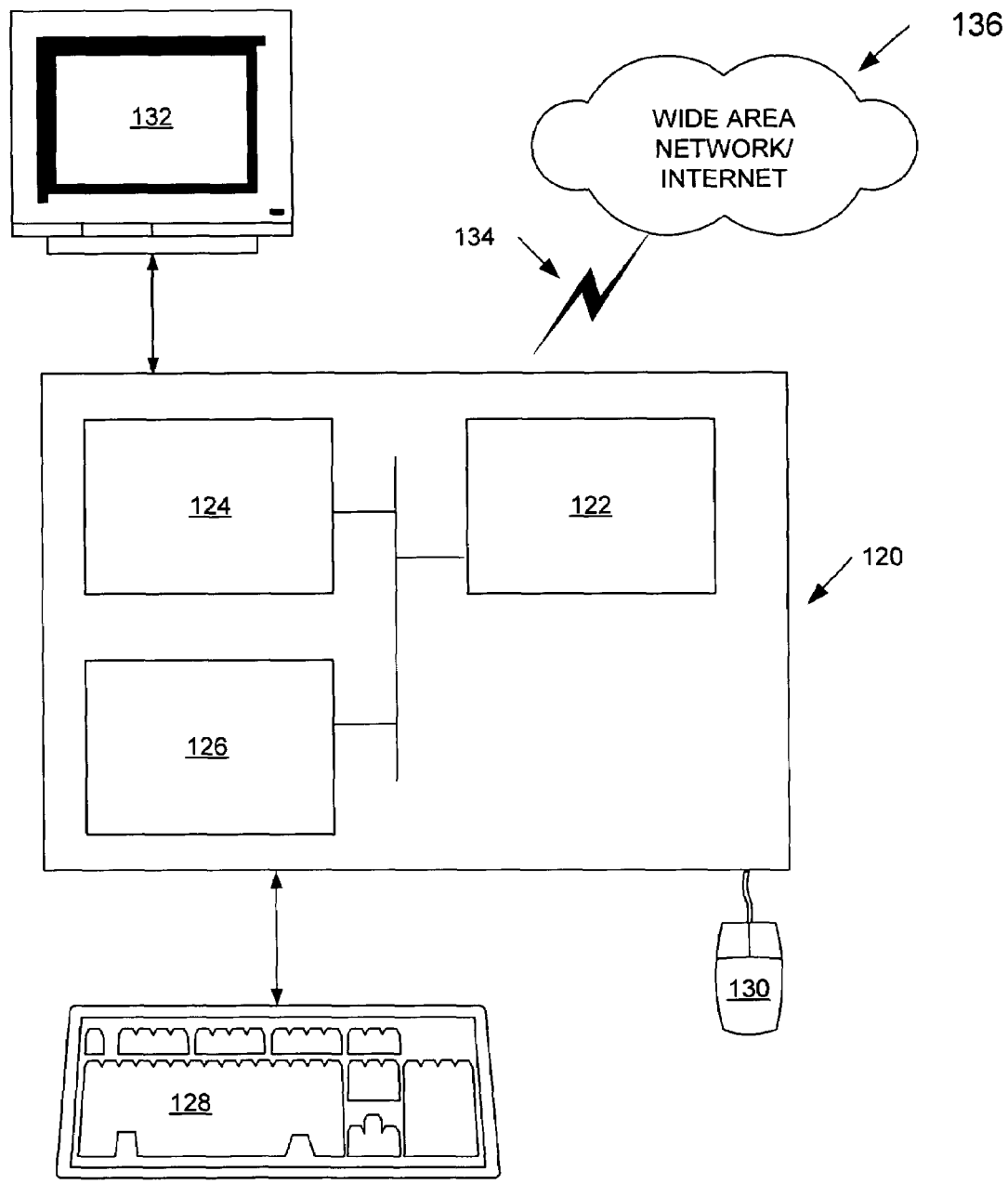
FIG. 3 shows a typical networked computer system.

The invention may be implemented on virtually any type computer regardless of the platform being used. For example, as shown in FIG. 3, a typical computer (120) includes a processor (122), an associated memory (124), a storage device (126), and numerous other elements and functionalities typical of today's computers (not shown). The computer (120) may also include input means, such as a keyboard (128) and a mouse (130), and an output device, such as a monitor (132). Those skilled in the art will appreciate that these input and output means may take other forms. The computer (120) may be connected via a network connection (134) to a Wide Area Network (WAN) (136), such as the Internet.

Aspects of the invention involve evaluating a simulation using a reference simulator and a test simulator. Aspects of the invention involve comparison of selected golden data from the reference simulator to selected test data from the test simulator before a simulation is complete on the test simulator. Aspects of the invention involve comparison of selected golden data from the reference simulator to selected test data from the test simulator before a simulation is complete on the reference simulator. Aspects of the invention involve obtaining user data, such as stimuli and comparison data, from a user and/or debugging the test simulator or design while a simulation is performed.

Figure 4:
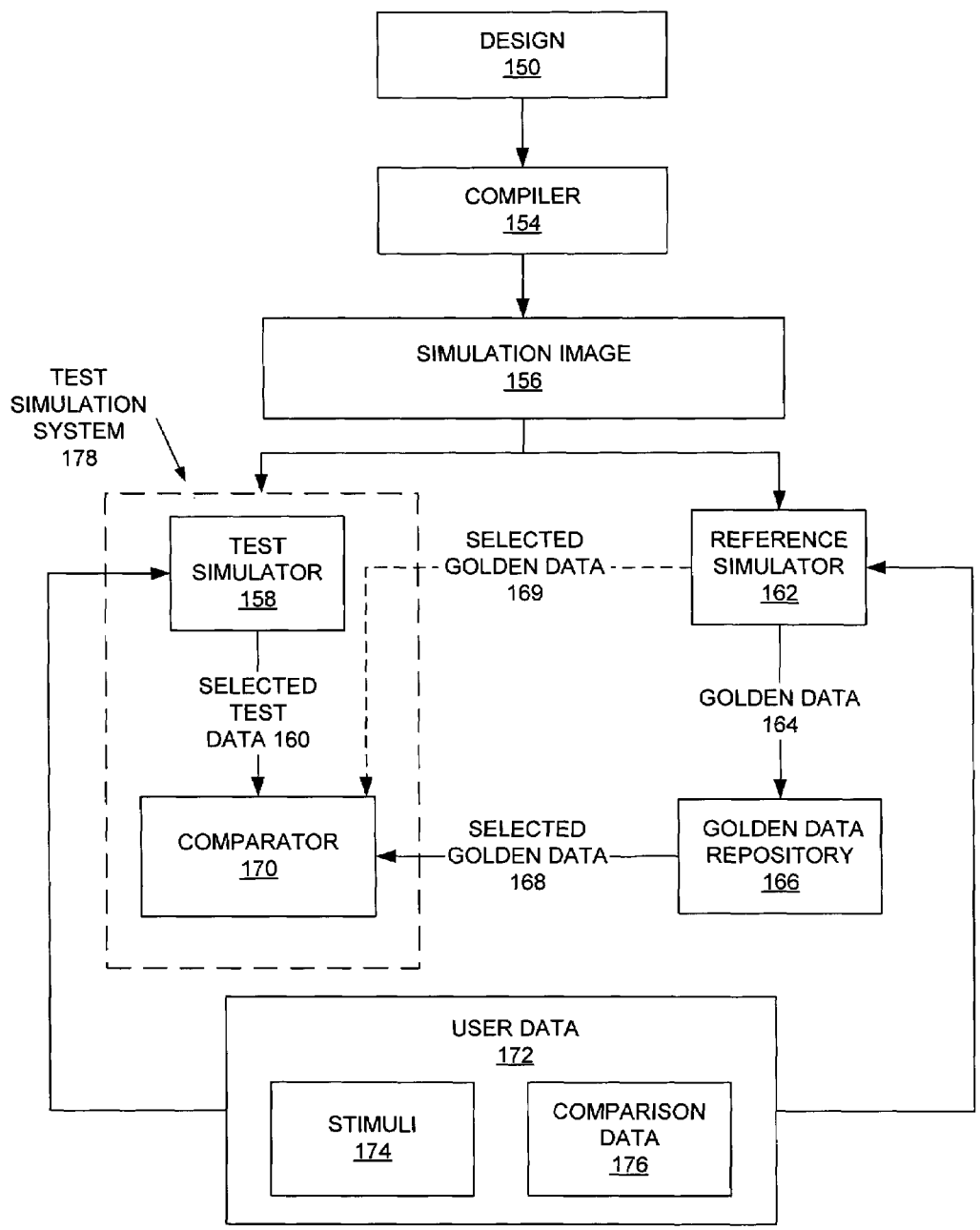
FIG. 4 shows a system for verification of a simulation using a reference simulator and a test simulator, in accordance with an embodiment of the invention.

A system for verification of a simulation using a reference simulator and a test simulator is shown in FIG. 4. The system includes a design (150) (e.g., a simulation or logic design), a compiler (154), a simulation image (156), the test simulator (158), selected test data (160), the reference simulator (162), golden data (164), a golden repository (166), selected golden data (168, 169), a comparator (170), and user data (172) (including stimuli (174) and comparison data (176)). In an embodiment of the invention, the test simulator (158) and the comparator (170) are known as a test simulation system (178).

The design (e.g., Verilog modules) (150) is compiled by the compiler (154), which generates the simulation image (156). The simulation image (156) is typically a binary executable file including instructions for performing a simulation on a computer, e.g., a computer or computers on which the reference simulator (162) and the test simulator (158) reside. In accordance with an embodiment of the invention, the reference simulator (162) and the test simulator (158) are software programs executing on specialized computing devices, such as hardware accelerators, or on general purpose computers, such as shown in FIG. 3.

The user data (172) includes data that is used to perform the simulation. In accordance with an embodiment of the invention, the user data (172) is provided by a user of the system while a simulation is being performed on the test simulator (158), or before a simulation is complete on the test simulator (158). In accordance with an embodiment of the invention, the user data (172) is provided by a user of the system before a simulation is performed on the test simulator (158).

The user data (172) includes stimuli (174), containing instructions for stimulating particular parts of the simulation image (156) during simulation to generate signal values during simulation. For example, the design (150) may include a particular circuit element, such as a register, an adder, or a gate, which is of interest to a designer who created the design (150). Thus, the designer includes an instruction in the stimuli (174) to send a stimulus, i.e., a particular input signal to the circuit element, e.g., the gate, at a particular point during the simulation. The effect of the stimulus generates a particular output, which may be used to determine whether the test simulator and/or design is working properly.

The user data (172) also includes comparison data (176), containing instructions that specify particular signal values of interest to the designer for comparison purposes. For example, the designer may want to compare the reference simulator (162) output of the aforementioned gate at a particular point of the simulation to the test simulator (158) output of the aforementioned gate at that point of the simulation. The comparison data (176) may include instructions from the designer that specify which signals of the simulation of the design are used for comparison purposes and at what point the signals are compared.

The user data (172), in accordance with an embodiment of the invention, includes one or more mapping rules for maps hierarchical features of different implementations of the design (150). For example, the design may be implemented differently for the reference simulator (162) and the test simulator (158). In this scenario, the design may be written using two different hardware description languages, resulting in two implementations. The two implementations, although functionally equivalent, have different internal hierarchies. Thus, two different versions of the simulation image (156) may be used to perform simulations on the test simulator (158) and the reference simulator (162). Thus, the designer may include mapping rules in the user data (172) for use by the comparator (170) in order to map an implementation of the design (150) for the test simulator (158) to an implementation of the design (150) for the reference simulator (162).

The comparator (170) compares selected golden data (168, 169) to selected test data (160). Selected test data (160) may be selected from test data generated by the test simulator (158) based on the comparison data (176). Similarly, selected golden data (169) may be selected from golden data generated by the reference simulator (162) based on the comparison data (176). Alternatively, in one embodiment of the invention, selected golden data (168) may be selected from the golden data repository (166) based on the comparison data (176).

For example, for the aforementioned gate, the comparator (170) may use the comparison data (176) to compare the output of the gate at a particular point for both the reference simulator (162) and the test simulator (158). If the comparison shows a difference between the output of the gate for the simulation performed on the reference simulator (162) and the output of the gate for the test simulator (158), the test simulator and/or design may be defective.

In accordance with an embodiment of the invention, functionality of the comparator (170) may reside on one or more computers (or computerized devices) separate from the test simulator (158). Alternatively, the comparator (170) may reside on one or more computers associated with the test simulator (158) and/or the reference simulator (162). The comparator (170) includes (or is in communication with) software components sufficiently configured to obtain the selected test data (160) and the selected golden data (168, 169). For example, the comparator (170) may include or use appropriate operating system functions or libraries, such as Application Programming Interfaces (API's) or Remote Procedure Calls (RPC's), etc.

Included in the system, but not shown, may be other software components (as needed), such as Command Line Tools (CLI's) and Graphical User Interfaces (GUI's) to enable a user (e.g., a designer or designers) to interact with the system. For example, a GUI for obtaining the user data may be included in the system. Other CLI's or GUI's may be used to control (i.e., stop and start) simulations, and to facilitate use of comparison results obtained from the comparator (170).

In accordance with an embodiment of the invention, the selected test data (160) is a portion of the test data available from the test simulator (158) as a result of the simulation performed on the test simulator (158). For example, hundreds or thousands of signals (i.e., waveforms) may be available from the test simulator (158) during or after a simulation, but the designer may select a fraction of the signals for comparison (using comparison data (176)). Likewise, the selected golden data (168) may be a portion of the golden data (164) stored in the golden data repository (166), which is available from the reference simulator (162) as a result of the simulation performed on the reference simulator (162).

The selected golden data (168) may be obtained statically and used for comparison purposes as appropriate for a particular embodiment of the invention or for particular needs of a designer. For example, the selected golden data (168) may be obtained and used for comparison purposes after the simulation that provided the selected golden data (168) has completed. For example, a simulation may be performed on the reference simulator (162) resulting in the golden data (164) being stored in the golden data repository (166). Then, hours, days, months, etc. afterward, a simulation may be performed on the test simulator accessing the selected golden data (168) from the golden data repository (166).

Alternatively, the selected golden data (169) may be obtained dynamically while the simulation is being performed on the reference simulator (162), instead of after the simulation has been performed on the reference simulator (162). For such an embodiment of the invention, a buffer (not shown) may be used to store the golden data (164) (prior to being selected) in a manner similar to a producer-consumer situation, as such is commonly understood and used by those skilled in the art.

For example, the reference simulator (162) and the test simulator (158) may perform a simulation of a design concurrently, i.e., in lockstep. As golden data (164) becomes available during the simulation, the golden data (164) is stored in a buffer (not shown). Once stored in the buffer, the comparator (170) may obtain the selected golden data (169) from the buffer (not shown) when available.

Whether the selected golden data (168, 169) is obtained dynamically (i.e., while the simulation on the reference simulator (162) is being performed), or statically (i.e., after the simulation on the reference simulator (162) has been performed), obtaining and comparing the selected golden data (168, 169) and the selected test data (160) may occur before the simulation is being performed on the test simulator (158). Further, obtaining and comparing the selected golden data (168, 169) and the selected test data (160) may occur at various times and intervals during the evaluation, as required and defined by the designer.

For example, the designer may use the comparison data (176) to obtain the selected golden data (168, 169) and/or the selected test data (160) every 100$^{th}$ cycle of the simulation. Alternatively, the selected golden data (168, 169) and/or the selected test data (160) may be obtained at varying or irregular intervals. Further, the designer may modify the frequency that the selected golden data (168, 169) and/or the selected test data (160) are obtained and compared while the simulation is being performed on the test simulator (158).

Figure 5:
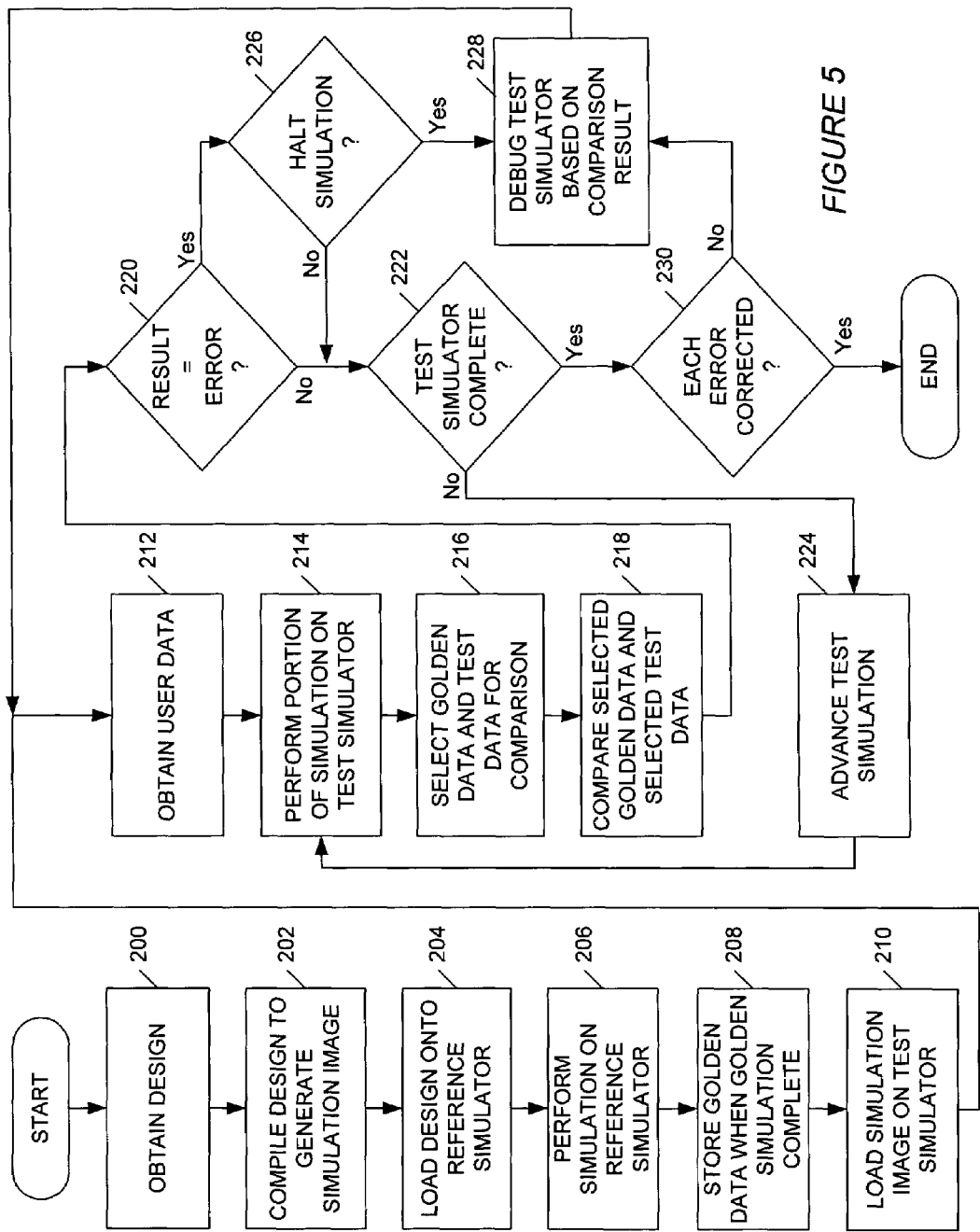
FIG. 5 shows a flowchart for static verification of a simulation, in accordance with an embodiment of the invention.

FIG. 5 shows a flowchart for static simulation verification using the system shown in FIG. 4. Initially, the design is obtained (Step 200). Typically, the design is created by a designer or team of designers using industry-standard tools designed for design verification. Then, the design is compiled using the compiler to generate a simulation image (Step 202). The simulation image is then loaded onto (Step 204) and performed on the reference simulator (Step 206). Performing the simulation typically involves executing the simulation image on the computer (such as the one shown in FIG. 3) executing the reference simulator.

Once the simulation has completed on the reference simulator, the golden data from the simulation is stored in a golden data repository (Step 208). In one embodiment of the invention, the golden data is a record of values of signals (i.e., waveforms) from the simulation. For example, a particular waveform may represent the output value of the aforementioned gate at specific points during the simulation.

Once the golden data has been stored, the simulation image is loaded onto the test simulator (Step 210). Next, user data is obtained from a user, e.g., a designer (Step 212). The user data includes stimuli and comparison data. In accordance with an embodiment of the invention, user data is organic (i.e., obtained within an indefinite amount of time, e.g., seconds, minutes, days, weeks, etc., after the simulation has been performed on the reference simulator).

Next, a portion of the simulation is performed on the test simulator (Step 214). In one embodiment of the invention, the quantity of the simulation (i.e., how large or small a portion) that is performed on the test simulator is determined by the user data to produce test data (i.e., waveforms of signals). The comparator then selects golden data and test data for comparison according to the instructions of the comparison data (Step 216). The selected golden data and selected test data are then compared to obtain a comparison result (Step 218).

If the comparison result is an error (Step 220), then the designer determines whether or not to halt simulation (Step 226). If the simulation is halted, the designer then debugs the test simulator (or the design) using the comparison result (Step 228). For example, the designer may detect an error if a mismatch between selected test data and selected reference data occurs. Correction of the error may require that the designer correct the simulator (or design), obtain user data (Step 212), and then continue evaluating the simulation (Steps 214-220).

If the comparison result is not an error (Step 230) or the simulation is not halted (Step 226), a determination is made whether the simulation on the test simulator is complete (Step 222). If the simulation is complete, a determination is made whether each error has been corrected (Step 230). If each error is corrected, the simulation ends. Otherwise, the designer may need to debug and correct the test simulator (or the design) using the comparison result (Step 228). Correction of the error may require that the designer correct the simulator (or design), obtain user data (Step 212), and then continue evaluating the simulation (Steps 214-220).

If the simulation is not complete, the simulation is advanced (Step 224) by advancing a cycle or a simulation clock. Steps 214-222 are performed until the simulation is complete.

Figure 6:
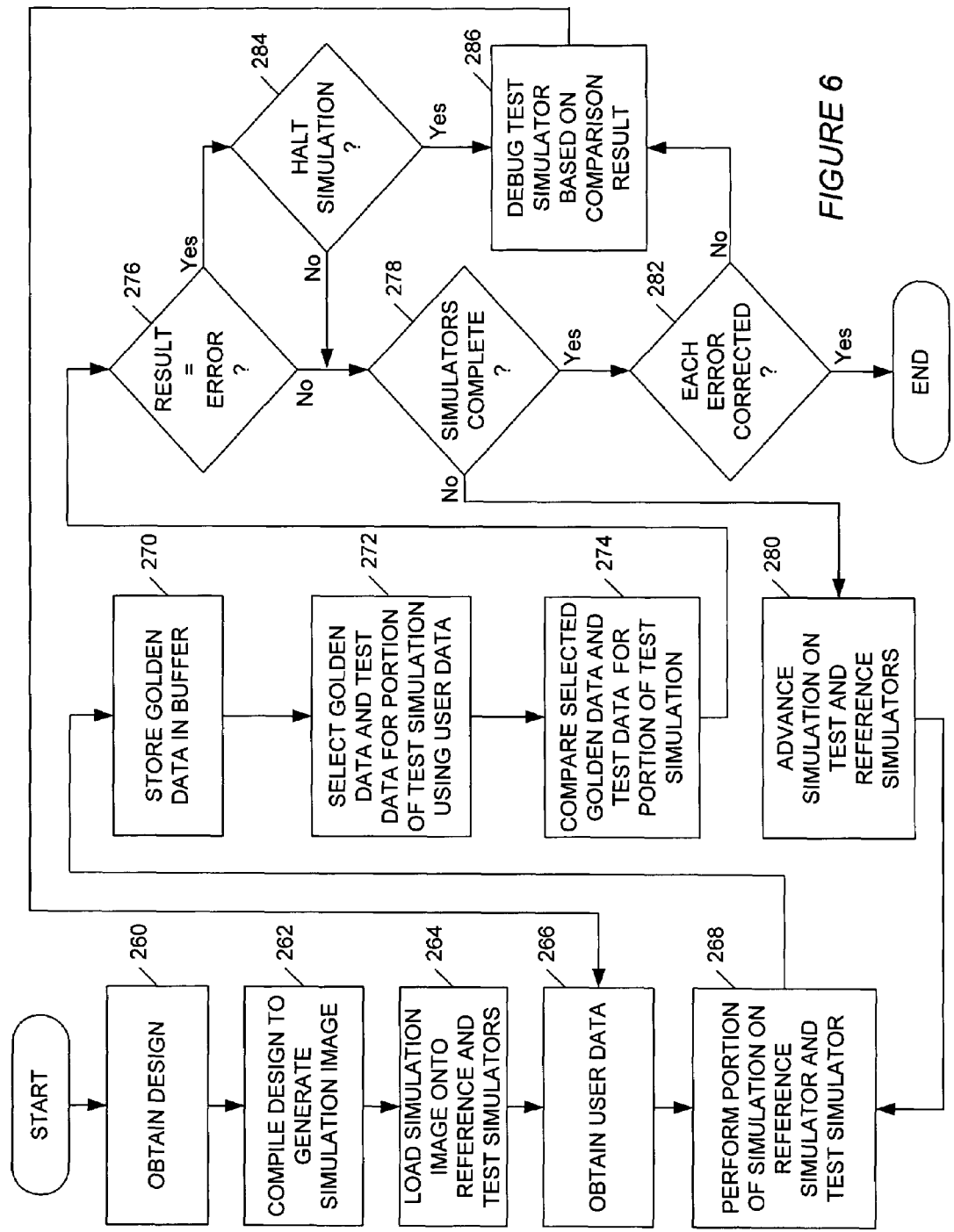
FIG. 6 shows a flowchart for dynamic verification of a simulation, in accordance with an embodiment of the invention.

FIG. 6 shows a flowchart for dynamic simulation verification using the system shown in FIG. 4 (i.e., when the selected golden data is obtained before a simulation supplying the selected golden data has been completed on a reference simulator). For example, a simulation may be performed concurrently on the reference simulator and a test simulator. In such a case, the reference simulator and the test simulator may perform a simulation in lockstep, with the golden data repository serving as a buffer.

Initially, the design is obtained (Step 260). Then, the design is compiled using the compiler to generate a simulation image (Step 262). The simulation image is then loaded onto the test simulator and the reference simulator (Step 264). The user data is obtained (Step 266) and used to determine the quantity of the simulation to be performed.

A portion of the simulation is then performed on the test simulator and the reference simulator (Step 268) as defined by the user data. Next, golden data from the portion of the simulation is stored in the golden data repository (e.g., the buffer) (Step 270). Once the golden data has been stored, the comparator then selects golden data and test data for comparison according to the instructions of the comparison data (Step 272).

Once obtained, the selected golden data and selected test data are then compared to obtain a comparison result (Step 274). If the comparison result is an error (Step 276), then the designer determines whether or not to halt simulation (Step 284). If the simulation is halted, the designer then debugs the test simulator (or the design) using the comparison result (Step 286). For example, the designer may detect an error if a mismatch between selected test data and selected reference data occurs. Correction of the error may require that the designer correct the simulator (or design), obtain user data (Step 266), and then continue evaluating the simulation (Steps 268-276).

If the comparison result is not an error (Step 276) or the simulation is not halted (Step 284), a determination is made whether the simulation on both the test simulator and the reference simulator is complete (Step 278). If the simulations are complete, a determination is made whether each error has been corrected (Step 282). If each error is corrected, the simulation ends. Otherwise, the designer may need to debug and correct the test simulator (or the design) using the comparison result (Step 228). Correction of the error may require that the designer correct the simulator (or design), obtain user data (Step 266), and then continue evaluating the simulation (Steps 268-276). If the simulation is not complete, the simulation is advanced on the test and reference simulators (Step 280) by advancing a cycle or a simulation clock. Steps 268-278 are performed until the simulation is complete.

As discussed earlier, the user data may be altered, modified, or replaced entirely during performance of simulation on either the test simulator or the reference simulator. Appropriate functionality for altering the user data may be included in the system. For example, the system may include functionality to lock out records and files used for storage of the golden data and for storage of the user data. Such functionality may include database file locking techniques and/or thread synchronization techniques, such as are well known to those skilled in the art.

Further, sequences of actions or operations shown in FIG. 5 and/or FIG. 6 may differ according to embodiments of the invention. For example, user data may be obtained before loading simulation images onto the reference simulator and/or the test simulator.

Embodiments of the present invention may have one or more of the following advantages. Verification of designs is streamlined by acceleration and automation of comparison of simulation results. For example, the present invention may enhance the speed and quality of simulation verification by enabling a designer to alter user data "on the fly," i.e., while the simulation is ongoing. Furthermore, the designer may debug the test simulator "on the fly." Therefore, the designer may view comparison results while the simulation proceeds, possibly enabling the designer to gain additional insight into debugging the simulation. Such additional insight may lead to altering the user data "on the fly" in order to better debug. Because altering user data and/or the test simulator may be accomplished without recompiling the design, verification is streamlined.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A system for evaluating simulators using a circuit design comprising:
   a processor;
   a reference simulator configured to generate golden data by executing a first simulation image using the processor, wherein the first simulation image is compiled from a first implementation of the circuit design;
   a test simulator configured to generate test data by executing a second simulation image, wherein the second simulation image is compiled from a second implementation of the circuit design; and
   a comparator configured to select a portion of the test data, use a mapping rule of a plurality of mapping rules to identify a portion of the golden data associated with the portion of the test data, and generate a comparison result by comparing the portion of the golden data to the portion of the test data before the execution of the second simulation image on the test simulator has completed,
   wherein the plurality of mapping rules map an internal hierarchy of the first implementation to an internal hierarchy of the second implementation,
   wherein the comparison result is used to debug the test simulator by correcting and displaying an error detected in the comparison result, and
   wherein the reference simulator executes the first simulation image in lockstep with execution of the second simulation image.

2. The system of claim 1 further comprising:
   a golden data repository storing the golden data.

3. The system of claim 1, wherein comparing the portion of the golden data to the portion of the test data occurs dynamically.

4. The system of claim 3 further comprising:
   a buffer to store the golden data.

5. The system of claim 4, wherein the comparator is configured to wait to compare the portion of the golden data to the portion of the test data until after the golden data is stored in the buffer.

6. The system of claim 1, wherein the mapping rule is obtained while the test simulator is halted.

7. A method of evaluating a test simulator using a circuit design comprising:
   executing a first simulation image on a reference simulator to obtain golden data, wherein the first simulation image is obtained by compiling a first implementation of the circuit design;
   executing a second simulation image on the test simulator to obtain test data, wherein the second simulation image is obtained by compiling a second implementation of the circuit design;
   selecting a portion of the test data;
   using a mapping rule of a plurality of mapping rules to identify a portion of the golden data associated with the portion of the test data;
   comparing the portion of the golden data to the portion of the test data to obtain a comparison result,
   wherein the plurality of mapping rules map an internal hierarchy of the first implementation to an internal hierarchy of the second implementation; and
   debugging the test simulator by correcting and displaying an error detected in the comparison result,
   wherein executing the first simulation image on the reference simulator is performed in lockstep with executing the second simulation image.

8. The method of claim 7 further comprising:
   storing the golden data in a golden data repository.

9. The method of claim 7, wherein the step of comparing the selected golden data to the selected test data waits on storing the golden data in a buffer.

10. The method of claim 7, wherein the step of selecting the portion of the test data is performed dynamically.

11. The method of claim 7, wherein the step of executing the second simulation image is halted to obtain the mapping rule.

12. A computer system for evaluating a test simulator using a circuit design comprising:
   a processor;
   a memory;
   a storage device; and
   software instructions stored in the memory for enabling the computer system to:
      execute a first simulation image on a reference simulator to obtain golden data, wherein the first simulation image is obtained by compiling a first implementation of the circuit design;
      execute a second simulation image on the test simulator to obtain test data, wherein the second simulation image is obtained by compiling a second implementation of the circuit design;
      select a portion of the test data;
      use a mapping rule of a plurality of mapping rules to identify a portion of the golden data associated with the portion of the test data;
      compare the portion of the golden data to the portion of the test data to obtain a comparison result,
      wherein the plurality of mapping rules map an internal hierarchy of the first implementation to an internal hierarchy of the second implementation; and
      debug the test simulator by correcting and displaying an error detected in the comparison result,
      wherein the reference simulator executes the first simulation image in lockstep with execution of the second simulation image.

13. The system of claim 1, wherein the portion of the test data is generated after the golden data is generated.

14. The method of claim 7, wherein the portion of the test data is generated after the golden data is generated.

15. The computer system of claim 12, wherein the portion of the test data is generated after the golden data is generated.

16. The method of claim 7,
wherein a user data is altered while executing the second simulation image, and
wherein the user data includes data that is used to evaluate the test simulator.

17. The method of claim 7, wherein the test simulator is debugged while executing the second simulation image.

18. The method of claim 7, wherein the comparison result is displayed while executing the second simulation image.

* * * * *